US009927470B2

(12) United States Patent
Zhu et al.

(10) Patent No.: US 9,927,470 B2
(45) Date of Patent: Mar. 27, 2018

(54) INTELLIGENT ELECTRONIC DEVICE HAVING A MEMORY STRUCTURE FOR PREVENTING DATA LOSS UPON POWER LOSS

(71) Applicant: Electro Industries/Gauge Tech, Westbury, NY (US)

(72) Inventors: Hai Zhu, Westbury, NY (US); Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 632 days.

(21) Appl. No.: 14/284,490

(22) Filed: May 22, 2014

(65) Prior Publication Data

US 2015/0338446 A1   Nov. 26, 2015

(51) Int. Cl.
*G01R 21/133* (2006.01)

(52) U.S. Cl.
CPC .................. *G01R 21/133* (2013.01)

(58) Field of Classification Search
CPC ................................................. G01R 21/133
USPC .............. 702/61; 219/233; 257/316; 361/65; 365/145; 709/224; 711/113
See application file for complete search history.

(56) References Cited

U.S. PATENT DOCUMENTS

| 5,459,850 A | 10/1995 | Clay et al. |
| 5,475,693 A | 12/1995 | Christopherson et al. |
| 5,485,595 A | 1/1996 | Assar et al. |
| 5,495,093 A * | 2/1996 | Griffith .................. B23K 3/033 219/233 |
| 5,586,291 A * | 12/1996 | Lasker ................ G06F 11/1435 711/113 |
| 5,598,370 A | 1/1997 | Niijima et al. |
| 5,634,050 A | 5/1997 | Krueger et al. |
| 5,640,529 A | 6/1997 | Hasbun |
| 5,650,936 A | 7/1997 | Loucks et al. |
| 5,736,847 A | 4/1998 | Van Doorn et al. |
| 5,787,445 A | 7/1998 | Daberko |
| 5,828,576 A | 10/1998 | Loucks et al. |

(Continued)

OTHER PUBLICATIONS

Xu Hong, Wang Jianhua, "An Extendable Data Engine based on OPC Specification", Computer Standards & Interfaces 26 (2004) 515-525; Dec. 5, 2003.

(Continued)

*Primary Examiner* — John H Le
(74) *Attorney, Agent, or Firm* — Gerald E. Hespos; Michael J. Porco; Matthew T. Hespos

(57) ABSTRACT

An intelligent electronic device is provided including, inter alia, a processing unit configured to calculate energy consumed by at least one load and accumulate the calculated energy in a first volatile memory; the processing unit being configured to iteratively copy the accumulated energy from the first volatile memory to a first non-volatile memory after a first predetermined time period and copy the accumulated energy from the first volatile memory to a second non-violate memory after a second predetermined time period, wherein the first predetermined time period is longer than the second predetermined time period. The processing unit is further configured to copy the accumulated energy from the second non-violate memory to the first volatile memory upon startup or reset of the intelligent electronic device to avoid loss of data.

50 Claims, 8 Drawing Sheets

(56) References Cited

U.S. PATENT DOCUMENTS

| | | | |
|---|---|---|---|
| 5,995,911 A | 11/1999 | Hart | |
| 6,000,034 A | 12/1999 | Lightbody et al. | |
| D427,533 S | 7/2000 | Cowan et al. | |
| D429,655 S | 8/2000 | Cowan et al. | |
| D435,471 S | 12/2000 | Simbeck et al. | |
| 6,185,508 B1 | 2/2001 | Van Doorn et al. | |
| 6,186,842 B1 | 2/2001 | Hirschbold et al. | |
| D439,535 S | 3/2001 | Cowan et al. | |
| 6,236,949 B1 | 5/2001 | Hart | |
| D443,541 S | 6/2001 | Hancock et al. | |
| 6,256,762 B1 | 7/2001 | Beppu | |
| 6,397,155 B1 | 5/2002 | Przydatek et al. | |
| D458,863 S | 6/2002 | Harding et al. | |
| D459,259 S | 6/2002 | Harding et al. | |
| 6,493,644 B1 | 12/2002 | Jonker et al. | |
| 6,563,697 B1 | 5/2003 | Simback et al. | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,636,030 B1 | 10/2003 | Rose et al. | |
| 6,671,635 B1 | 12/2003 | Forth et al. | |
| 6,671,654 B1 | 12/2003 | Forth et al. | |
| 6,687,627 B1 | 2/2004 | Gunn et al. | |
| 6,694,270 B2 | 2/2004 | Hart | |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,792,337 B2 | 9/2004 | Blackett et al. | |
| 6,792,364 B2 | 9/2004 | Jonker et al. | |
| 6,798,190 B2 | 9/2004 | Harding et al. | |
| 6,798,191 B1 | 9/2004 | Macfarlane et al. | |
| 6,813,571 B2 | 11/2004 | Lightbody et al. | |
| 6,825,776 B2 | 11/2004 | Lightbody et al. | |
| 6,853,978 B2 | 2/2005 | Forth et al. | |
| 6,871,150 B2 | 3/2005 | Huber et al. | |
| D505,087 S | 5/2005 | Ricci et al. | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,983,211 B2 | 1/2006 | Macfarlene et al. | |
| 6,988,025 B2 | 1/2006 | Ransom et al. | |
| 6,988,182 B2 | 1/2006 | Teachman et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,072,779 B2 | 7/2006 | Hancock et al. | |
| 7,085,824 B2 | 8/2006 | Forth et al. | |
| 7,089,089 B2 | 8/2006 | Cumming et al. | |
| 7,096,316 B1 | 8/2006 | Karr et al. | |
| 7,127,328 B2 | 10/2006 | Ransom | |
| D532,747 S | 11/2006 | Ricci et al. | |
| 7,136,384 B1 | 11/2006 | Wang | |
| D534,120 S | 12/2006 | Ricci et al. | |
| 7,155,350 B2 | 12/2006 | Kagan et al. | |
| 7,158,050 B2 | 1/2007 | Lightbody et al. | |
| 7,174,258 B2 | 2/2007 | Hart | |
| 7,174,261 B2 | 2/2007 | Gunn et al. | |
| 7,184,904 B2 | 2/2007 | Kagan | |
| 7,188,003 B2 | 3/2007 | Ransom et al. | |
| 7,191,076 B2 | 3/2007 | Huber et al. | |
| 7,216,043 B2 | 5/2007 | Ransom et al. | |
| 7,246,014 B2 | 7/2007 | Forth et al. | |
| 7,248,977 B2 | 7/2007 | Hart | |
| 7,248,978 B2 | 7/2007 | Ransom | |
| 7,249,265 B2 | 7/2007 | von Carolsfeld et al. | |
| 7,256,709 B2 | 8/2007 | Kagan | |
| 7,271,996 B2 | 9/2007 | Kagan | |
| 7,294,997 B2 | 11/2007 | Kagan | |
| 7,304,586 B2 | 12/2007 | Wang et al. | |
| 7,305,310 B2 | 12/2007 | Slota et al. | |
| 7,337,081 B1 | 2/2008 | Kagan | |
| 7,472,138 B2 | 12/2008 | Adkins et al. | |
| 9,251,003 B1 * | 2/2016 | Gupta | G06F 11/1469 |
| 2002/0051466 A1 | 5/2002 | Bruckman | |
| 2002/0114326 A1 | 8/2002 | Mahalingalah | |
| 2002/0162014 A1 | 10/2002 | Przydatek et al. | |
| 2002/0165677 A1 | 11/2002 | Lightbody et al. | |
| 2002/0166022 A1 | 11/2002 | Suzuki | |
| 2002/0188814 A1 | 12/2002 | Saito et al. | |
| 2003/0003908 A1 | 1/2003 | McGrew et al. | |
| 2003/0014200 A1 | 1/2003 | Jonker et al. | |
| 2003/0065459 A1 | 4/2003 | Huber et al. | |
| 2003/0101008 A1 | 5/2003 | Hart | |
| 2003/0105608 A1 | 6/2003 | Hart | |
| 2003/0132742 A1 | 7/2003 | Harding et al. | |
| 2003/0154471 A1 | 8/2003 | Teachman et al. | |
| 2003/0185042 A1 * | 10/2003 | Kato | G11C 11/22 365/145 |
| 2003/0210699 A1 | 11/2003 | Holt, Sr. et al. | |
| 2003/0212512 A1 | 11/2003 | Hart | |
| 2003/0220752 A1 | 11/2003 | Hart | |
| 2004/0028041 A1 | 2/2004 | Yasue | |
| 2004/0066311 A1 | 4/2004 | Giles et al. | |
| 2004/0138786 A1 | 7/2004 | Blackett et al. | |
| 2004/0138787 A1 | 7/2004 | Ransom et al. | |
| 2004/0138835 A1 | 7/2004 | Ransom et al. | |
| 2004/0172207 A1 | 9/2004 | Hancock et al. | |
| 2004/0183522 A1 | 9/2004 | Gunn et al. | |
| 2004/0229578 A1 | 11/2004 | Lightbody et al. | |
| 2005/0017874 A1 | 1/2005 | Lightbody et al. | |
| 2005/0027464 A1 | 2/2005 | Jonker et al. | |
| 2005/0071106 A1 | 3/2005 | Huber et al. | |
| 2005/0275397 A1 | 12/2005 | Lightbody et al. | |
| 2005/0281105 A1 | 12/2005 | Oshima | |
| 2005/0288876 A1 | 12/2005 | Doig et al. | |
| 2005/0288877 A1 | 12/2005 | Doig et al. | |
| 2006/0039196 A1 | 2/2006 | Gorobets et al. | |
| 2006/0052958 A1 | 3/2006 | Hancock et al. | |
| 2006/0071813 A1 | 4/2006 | Kagan | |
| 2006/0077999 A1 | 4/2006 | Kagan et al. | |
| 2006/0086893 A1 | 4/2006 | Spanier et al. | |
| 2006/0106972 A1 | 5/2006 | Gorobets et al. | |
| 2006/0161400 A1 | 7/2006 | Kagan et al. | |
| 2006/0170409 A1 | 8/2006 | Kagan et al. | |
| 2006/0230394 A1 | 10/2006 | Forth et al. | |
| 2006/0261401 A1 * | 11/2006 | Bhattacharyya | B82Y 10/00 257/316 |
| 2006/0271244 A1 | 11/2006 | Cumming et al. | |
| 2007/0067119 A1 | 3/2007 | Loewen et al. | |
| 2007/0067121 A1 | 3/2007 | Przydatek et al. | |
| 2007/0136010 A1 | 6/2007 | Gunn et al. | |
| 2007/0150214 A1 | 6/2007 | Qin et al. | |
| 2008/0046205 A1 | 2/2008 | Gilbert et al. | |
| 2008/0065335 A1 | 3/2008 | Doig et al. | |
| 2008/0086222 A1 | 4/2008 | Kagan | |
| 2008/0195794 A1 | 8/2008 | Banker et al. | |
| 2008/0235355 A1 | 9/2008 | Spanier et al. | |
| 2010/0090680 A1 | 4/2010 | Banhegyesi | |
| 2011/0242715 A1 * | 10/2011 | Voisine | G01R 11/17 361/65 |
| 2013/0205022 A1 * | 8/2013 | Kagan | H04L 67/06 709/224 |

OTHER PUBLICATIONS

Datasheet for MB85R256F Memory FRAM; Fujitsu Semiconductor Limited; Document No. DS501-00011-1v0-E; Copyright 2011.

Datasheet for FM25V20 2-Mbit (256K x 8) Serial (SPI) F-RAM; Cypress Semiconductor Corporation; Document No. 001-84500 rev. D; Jan. 23, 2014.

Datasheet for AM29F010B 1 Megabit (128K x 8-bit) CMOS 5.0 volt-only, Uniform Sector Flash Memory; Advanced Micro Devices, Inc.; Publication # 22336 Rev: C; Nov. 18, 2002.

Datasheet AT28C64B 64 (8k x8) Parallel EEPROM with Page Write and Software Data Protection; Atmel Corporation; Document No. 0270L-PEEPR; Feb. 2009.

* cited by examiner

INTELLIGENT ELECTRONIC DEVICE HAVING A MEMORY STRUCTURE FOR PREVENTING DATA LOSS UPON POWER LOSS

BACKGROUND

Field

The present disclosure relates generally to intelligent electronic devices (IEDs) and, in particular, to an intelligent electronic device and method thereof for preventing loss of data on a loss of power to the intelligent electronic device.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g., a modem, a wireless connection or a network. IEDs also include legacy mechanical or electromechanical devices that have been retrofitted with appropriate hardware and/or software allowing integration with the power management system.

Electronic devices, including power metering devices, have the need to record information that is retained when the device loses main power. The operating program, configuration data and collected information, all have a need to be maintained by the device. EEPROMs; battery-backed RAMs or NVRAMs; and FLASH have been commonly used for this purpose, with various pros and cons.

Historically, EEPROMs have been extensively used for non-volatile memory storage; that is, they retain information when the device has no power. EEPROM stands for Electronically Erasable Programmable Read-Only Memory. EEPROMs come in many sizes, but typically are used for smaller memory applications. By using floating-gate arrays, EEPROMS can store on or off states, 0 or 1 values, by either draining or storing electrons in the floating gates; Once stored, power need not be maintained to the gates to retain the states. With an EEPROM, any byte can be changed at any time, independent of the values of the other bytes; however, it typically takes a longer time to change a byte in an EEPROM than it takes for a microprocessor to send the command to the EEPROM to write the byte. Many EEPROMs allow multi-byte writes, allowing the microprocessor to provide without delay a short sequence of bytes to be written, with an increase both in the delay before the new values are written and in the delay before additional bytes may be written.

Battery-backed RAMs or NVRAMs (which stand for Non-Volatile Random Access Memory) are another option for non-volatile memory storage. These are regular RAM devices, that would ordinarily lose stored information if the device loses power, but rather than relying exclusively on system power, these devices will alternately be powered by a battery, either separately or, in the case of NVRAMs, as part of the device itself. As RAM devices, they typically operate without delays. While typically larger than EEPROMs in terms of memory size, because they still require power to maintain their memory states when there is no system power, there tend to be limits on the usable size of Battery-backed RAMs or NVRAMs in a system. As well, because they are drawing power from the battery to maintain the memory state when system power is not available, the usefulness of the NVRAM is limited by the capacity of the battery used. Plus, in terms of physical size (as well as cost), the use of batteries increases the size of the necessary components, and could require design considerations if the need to replace batteries is important.

In recent times, FLASH memory has seen a rise in use in many applications. FLASH is not an acronym, instead the word 'flash' is used because the erasure of large pages of memory was originally described as being like the flash of a camera. FLASH memory is similar to EEPROMs, in that there are delays in the process of changing information stored on a FLASH. With EEPROMs, writing to a byte internally involves first erasing the byte to clear the old pattern, followed by writing the new pattern; with FLASH, erasing is a separate external step, performed on a page of bytes all at once, which can then be followed by writing new patterns. Rather than allowing individual byte or small group modifications with moderate delays, FLASH organizes memory into large sectors. Erasing a sector at a time requires a large delay (but usually shorter than the sum of the internal times it takes to erase/clear equivalent numbers of bytes in EEPROMs), while writing bytes to a sector involve individual delays smaller than those typical for writing bytes to an EEPROM.

Therefore, a need exists for techniques for saving data on a power loss to prevent loss of data while overcoming the above-described disadvantages.

SUMMARY

An intelligent electronic device and method thereof for preventing loss of data on a loss of power to the intelligent electronic device are provided. By employing a memory structure in accordance with the present disclosure, the intelligent electronic device stores data with at least two different rates on two different types of memory. A first memory has a large capacity for long term storage, e.g., a FLASH memory. While suitable for storing large amounts of data, the first memory has a complicated write sequence which incurs delays making it unsuitable for storing data on a power loss. The second memory is configured for faster write performance and a much greater maximum number of write-erase cycles (e.g., exceeding $10^{16}$ for 3.3 V devices), e.g., a ferroelectric random access memory (FRAM) or a magnetoresistive random access memory (MRAM). Due to the faster write performance and large number of write-erase cycles, the second memory can store data more rapidly than the first memory with no regard for the second memory wearing out. In this manner, the second memory stores data at a faster rate (e.g., up to 300 times faster) than the first memory making it more suitable for storing data in the event of a power loss.

According to one embodiment of the present disclosure, an intelligent electronic device is provided including, inter alia, at least one sensor configured for sensing at least one electrical parameter distributed to a load; at least one analog-to-digital converter coupled to the at least one sensor and configured for converting an analog signal output from the at least one sensor to a digital data; and a processing unit coupled to the at least one analog-to-digital converter configured to receive the digital data, calculate energy consumed by the load and accumulate the calculated energy in a first volatile memory; the processing unit being configured to iteratively copy the accumulated energy from the first volatile memory to a first non-volatile memory after a first predetermined time period and copy the accumulated energy from the first volatile memory to a second non-violate memory after a second predetermined time period, wherein the first predetermined time period is longer than the second predetermined time period. The processing unit is further configured to copy the accumulated energy from the second non-violate memory to the first volatile memory upon startup or reset of the intelligent electronic device.

In one aspect, the first non-volatile memory is a flash memory and the second non-volatile memory is a ferroelectric random access memory (FRAM) or a magnetoresistive random access memory (MRAM).

In another aspect, the second non-volatile memory does not require a battery backup to retain the data stored thereon and has a data retention capability of at least 10 years.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
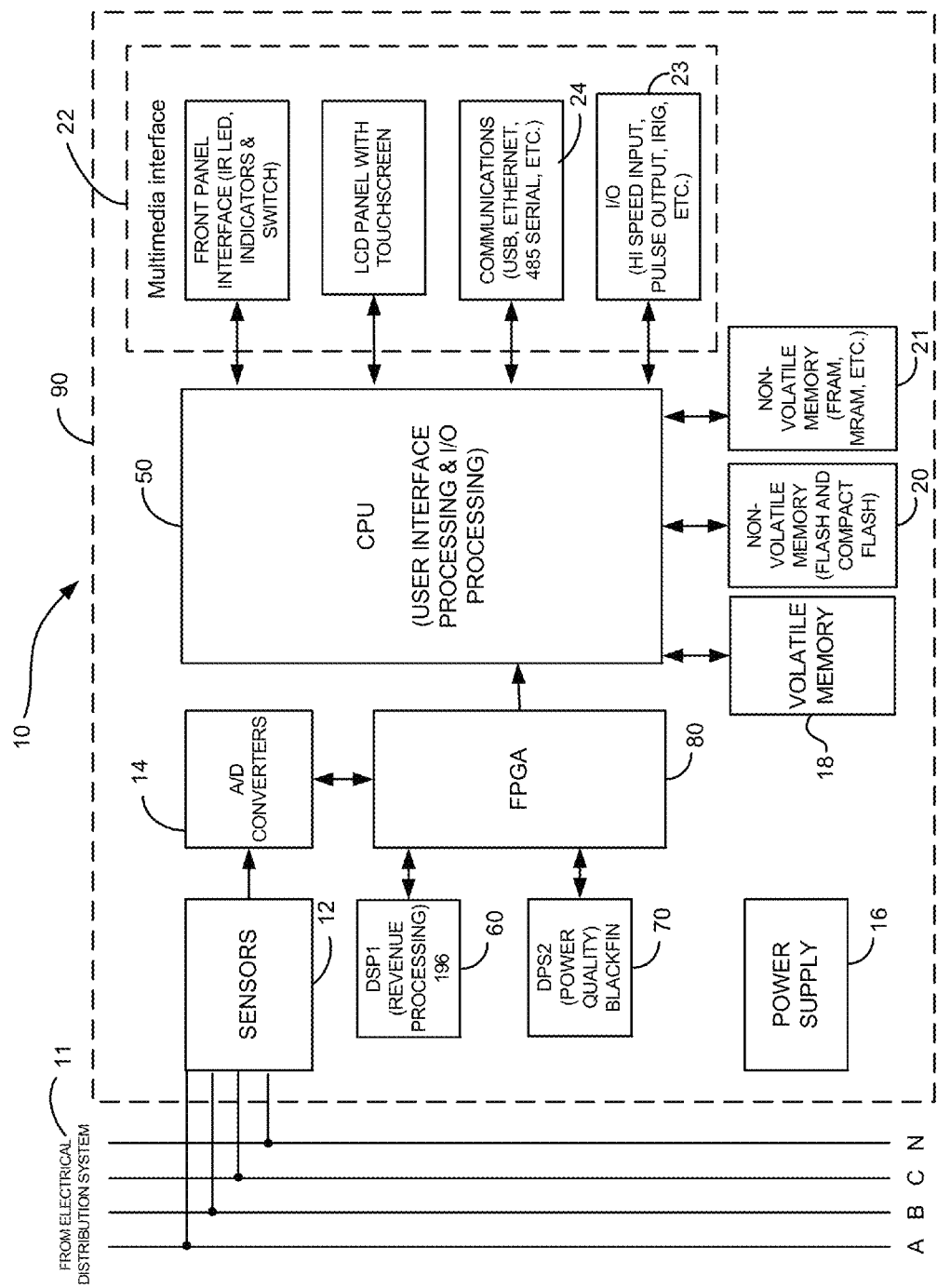
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, an non-volatile memory 20, a multimedia user interface 20, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processor 60. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A-2H.

The plurality of sensors 12 sense electrical parameters, e.g., voltage and current, on incoming lines, (i.e., phase A, phase B, phase C, neutral N), from an electrical power distribution system 11 e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14 are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .mlv, .mp2v.mpeg2), Microsoft Recorded TV Show files (.dvr-ms), Microsoft Windows Video files (.avi) and Microsoft Windows Audio files (.wav).

The IED 10 further includes an input/output (I/O) interface 23, which may be in the form of hardwired I/O interface or expandable input and output cards. These cards can be used to provide information such as but not limited to different protocols, analog retransmits, fiber optic outputs, Ethernet, cellular, 802.11 WIFI, Zigbee and/or 802.15 capabilities. There are other types of said I/O that are not mentioned herein in this application which are also deemed to be part of this disclosure. The Ethernet card can be used to provide a DNP 3.0 over Ethernet output or to provide an IEC 61850 output over Ethernet. One Ethernet card can also be used to provide multiple protocols simultaneously. The cards shall be capable of supporting at least one session of at least one protocol. Multi-session, multi-protocol is also envisioned and deemed to be within the scope of the present disclosure. Having the revenue meter utilize IEC 61850 protocol allows the meter to be part of the smart substation network. Perform as a logical node on a network, it can provide real time data on voltage, current, power and energy or other parameters to a smart RTU or other IED device. Additionally, energy billing data can be sent to traditional energy billing software to collect energy usage data about that substation. It is envisioned that this type of topology and/or architecture is not limited to any particular installation and can be applied anywhere energy meters or other IED are used.

The input and output cards shall be field upgradable and mounted internally in the meter so that the end user can open the meter and plug the card into the meter motherboard housing. This allows the meter to have the ability to have a user upgrade the meter after it's been purchased. Moreover, since the I/O cards are field upgradable, the user can add and/or change radio capability to a meter at a later date which is important because radio technology changes quickly and makes existing metering technology quickly obsolete.

The IED 10 further comprises a volatile memory 18, a first non-volatile memory 20 and a second non-volatile memory 21. In addition to storing audio and/or video files, volatile memory 18 will store the sensed and generated data for further processing and for retrieval when called upon to be displayed at the IED 10 or from a remote location. The volatile memory 18 includes internal storage memory, e.g., random access memory (RAM), and the non-volatile memories 20, 21 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

Furthermore, the non-volatile memories 20, 21 may include a ferroelectric random access memory (FRAM) or a magnetoresistive random access memory (MRAM), which have high-speed write performance and a large number of write-erase cycles. Such memories may be employed to prevent data loss upon a loss of power to the IED, the details of which will be provided below.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission, cellular transmission or any other type of communication protocols, communication architecture or systems currently existing or to be developed for wirelessly transmitting data including spread spectrum 900 MHz, or other frequencies, Zigbee, WiFi, or any mesh enabled wireless communication. The communication device 24 can be used to provide a DNP 3.0 over Ethernet output or to provide an IEC 61850 output over Ethernet.

The IED 10 may communicate to a server or other computing device via the communication device 24 or I/O interface 23. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2A:
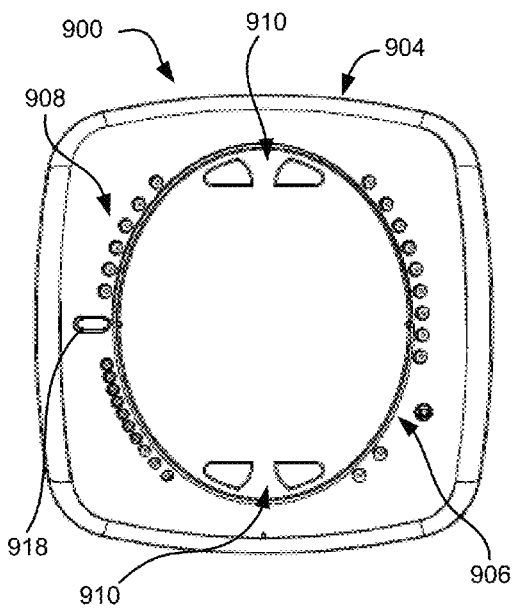
FIGS. 2A-2H illustrate exemplary form factors for an intelligent electronic device (IED) in accordance with an embodiment of the present disclosure.
Figure 2B:
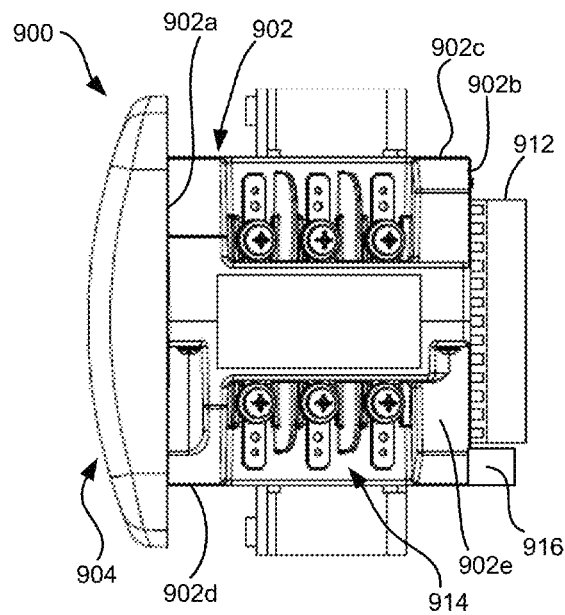

Furthermore, it is to be appreciated that the components and devices of the IED 10 of FIG. 1 may be disposed in various housings depending on the application or environment. For example, the IED 10 may be configured as a panel meter 900 as shown in FIG. 2A an 2B. The panel meter 900 of FIGS. 2A and 2B is described in more detail in commonly owned U.S. Pat. No. 7,271,996, the contents of which are hereby incorporated by reference. As seen in FIGS. 2A and 2B, the IED 900 includes a housing 902 defining a front surface 902a, a rear surface 902b, a top surface 902c, a bottom surface 902d, a right side surface 902e, and a left side surface (not shown). Electrical device 900 includes a face plate 904 operatively connected to front surface 902a of housing 902. Face plate 904 includes displays 906, indicators 908 (e.g., LEDs and the like), buttons 910, and the like providing a user with an interface for visualization and operation of electrical device 100. For example, as seen in FIG. 2A, face plate 904 of electrical device 900 includes analog and/or digital displays 906 capable of producing alphanumeric characters. Face plate 904 includes a plurality of indicators 908 which, when illuminated, indicate to the user the "type of reading", the "% of load bar", the "parameter designation" which indicates the reading which is being displayed on displays 906, a "scale selector" (e.g., Kilo or Mega multiplier of Displayed Readings), etc. Face plate 904 includes a plurality of buttons 910 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states. The housing 902 includes voltage connections or inputs 912 provided on rear surface 902b thereof, and current inputs 914 provided along right side surface 902e thereof. The IED 900 may include a first interface or communication port 916 for connection to a master and/or slave device. Desirably, first communication port 916 is situated in rear surface 902b of housing 902. IED 900 may also include a second interface or communication port 918 situated on face plate 904.

Figure 2C:
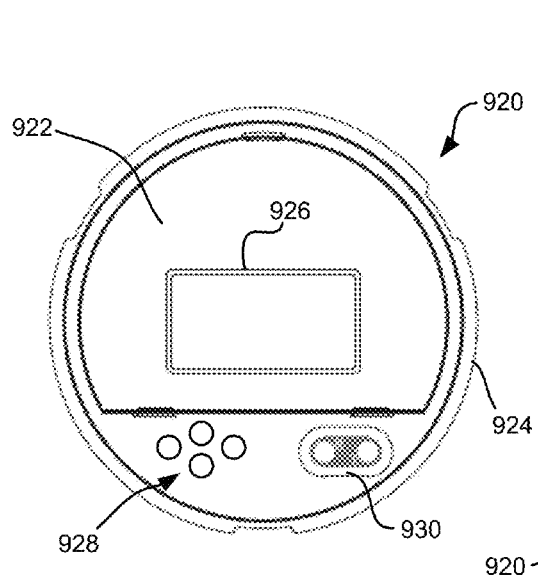
Figure 2D:
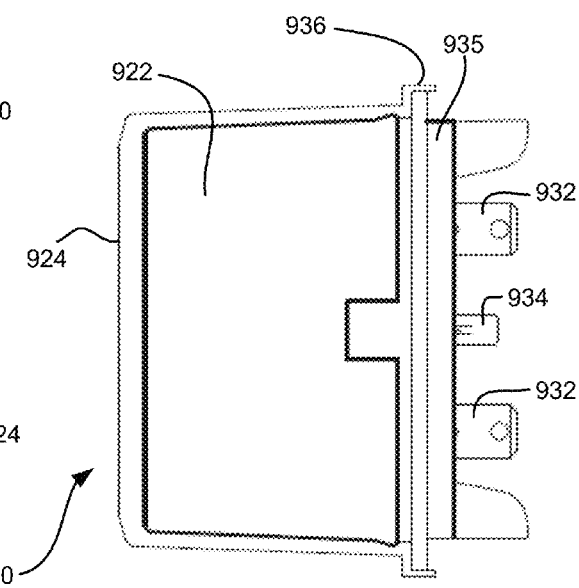

In other embodiment, the IED 10 may be configured as a socket meter 920, also known as a S-base type meter or type S meter, as shown in FIG. 2C an 2D. The socket meter 920 of FIGS. 2C and 2D is described in more detail in commonly owned application Ser. No. 12/578,062 (U.S. Publication No. 2010/0090680), the contents of which are hereby incorporated by reference. Referring to FIGS. 2C and 2D, the meter 920 includes a main housing 922 surrounded by a cover 924. The cover 924 is preferably made of a clear material to expose a display 926 disposed on the main body 922. An interface 928 to access the display and a communication port 930 is also provided and accessible through the cover 924. The meter 920 further includes a plurality of current terminals 932 and voltage terminals 934 disposed on backside of the meter extending through a base 935. The terminals 932, 934 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 936 is used as a seal between the meter 920 and/or cover 924 and the meter socket to prevent removal of the meter and to indicate tampering with the meter.

Figure 2E:
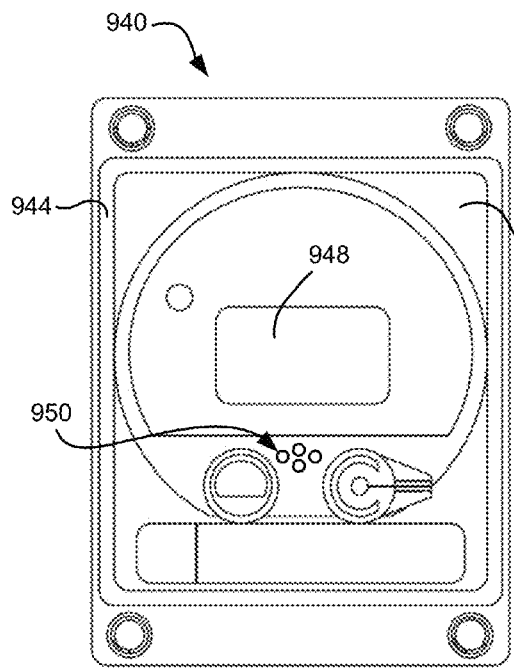
Figure 2F:
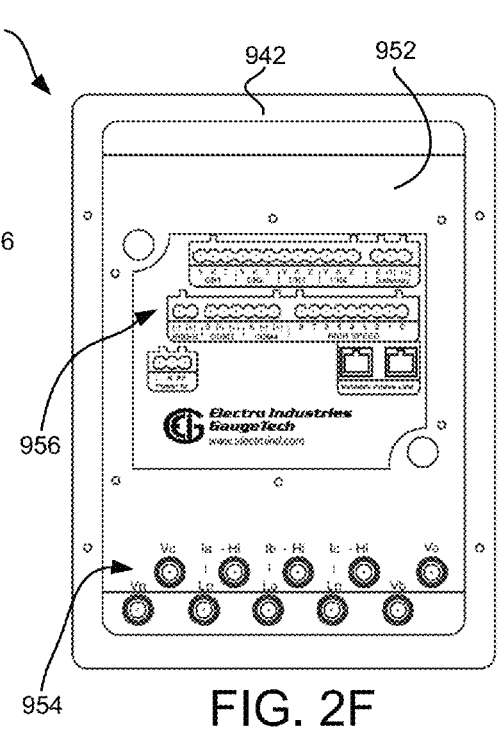

In a further embodiment, the IED 10 of FIG. 1 may be disposed in a switchboard or draw-out type housing 940 as shown in FIGS. 2E and 2F, where FIG. 2E is a front view and FIG. 2F is a rear view. The switchboard enclosure 942 usually features a cover 944 with a transparent face 946 to allow the meter display 948 to be read and the user interface 950 to be interacted with by the user. The cover 944 also has a sealing mechanism (not shown) to prevent unauthorized access to the meter. A rear surface 952 of the switchboard enclosure 942 provides connections for voltage and current inputs 954 and for various communication interfaces 956. Although not shown, the meter disposed in the switchboard enclosure 942 may be mounted on a draw-out chassis which is removable from the switchboard enclosure 942. The draw-out chassis interconnects the meter electronics with the electrical circuit. The draw-out chassis contains electrical connections which mate with matching connectors 954, 956 disposed on the rear surface 952 of the enclosure 942 when the chassis is slid into place.

Figure 2G:
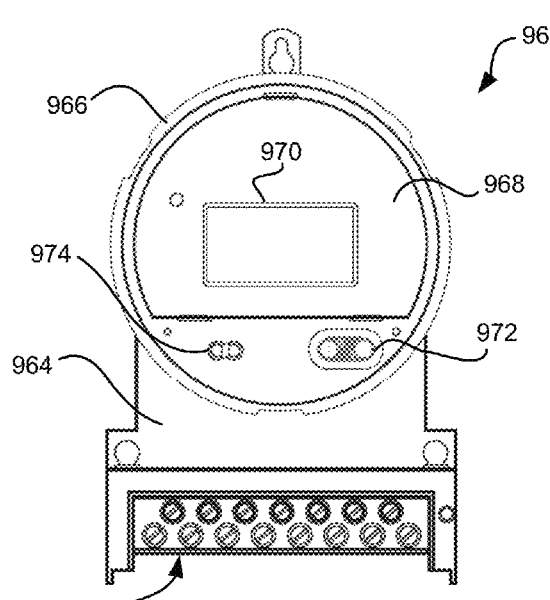
Figure 2H:
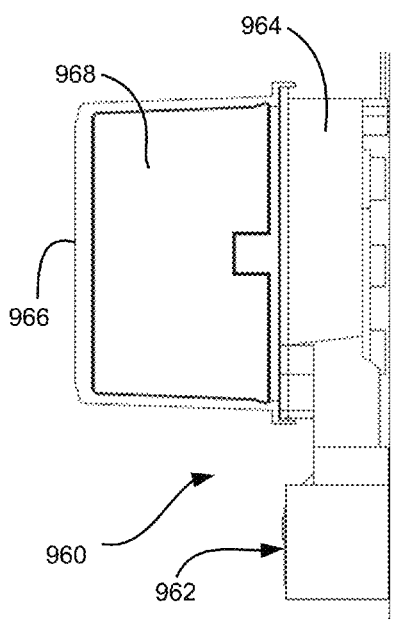

In yet another embodiment, the IED 10 of FIG. 1 may be disposed in a A-base or type A housing as shown in FIGS. 2G and 2H. A-base meters 960 feature bottom connected terminals 962 on the bottom side of the meter housing 964. These terminals 962 are typically screw terminals for receiving the conductors of the electric circuit (not shown). A-base meters 960 further include a meter cover 966, meter body 968, a display 970 and input/output means 972. Further, the meter cover 966 includes an input/output interface 974. The cover 966 encloses the meter electronics 968 and the display 970. The cover 966 has a sealing mechanism (not shown) which prevents unauthorized tampering with the meter electronics.

It is to be appreciated that other housings and mounting schemes, e.g., circuit breaker mounted, are contemplated to be within the scope of the present disclosure.

Figure 3:
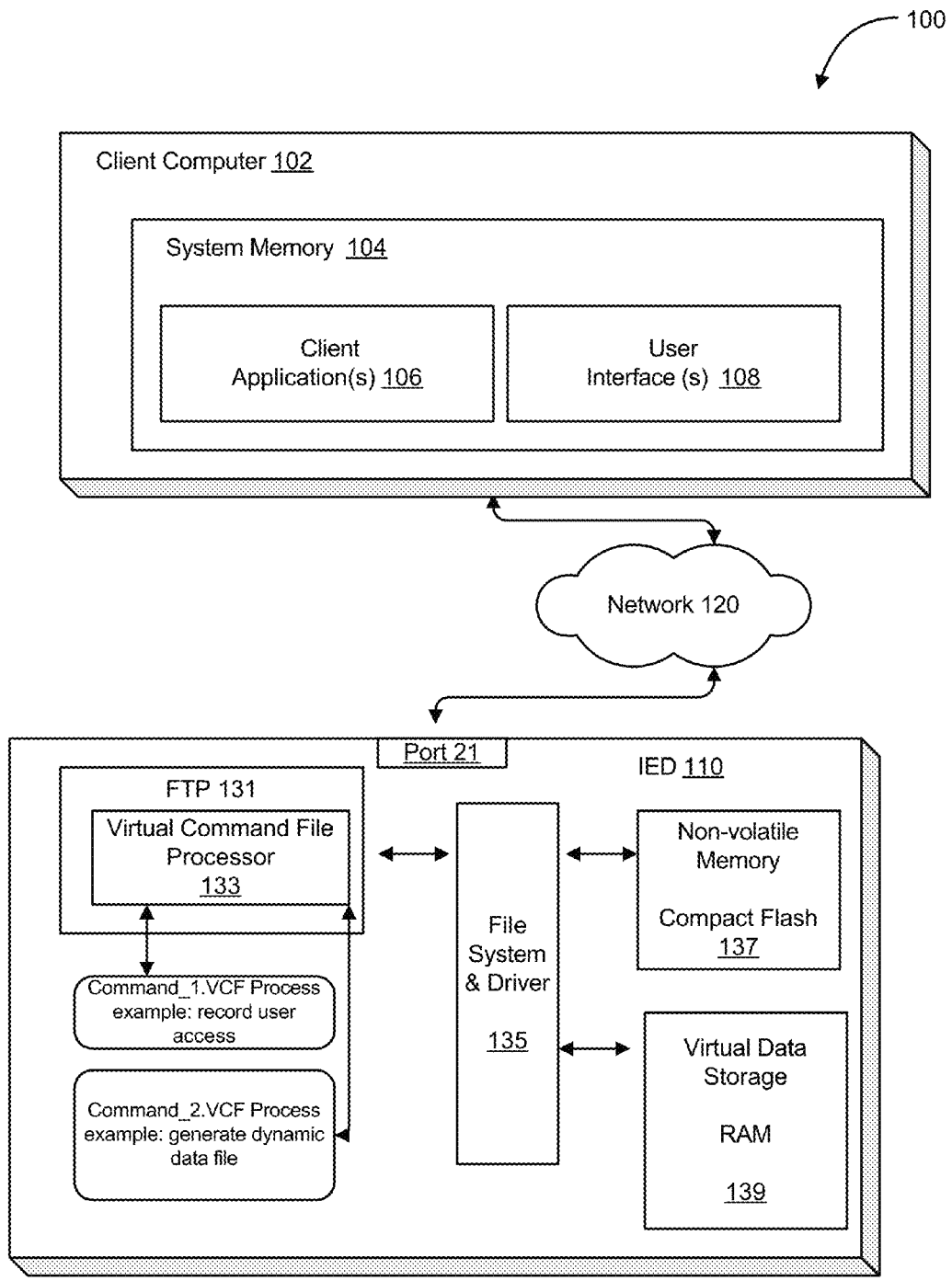
FIG. 3 illustrates an environment in which the present disclosure may be utilized.

FIG. 3 illustrates an exemplary environment 100 in which the present disclosure may be practiced. The network 120 may be the Internet, a public or private intranet, an extranet, wide area network (WAN), local area network (LAN) or any other network configuration to enable transfer of data and commands. An example network configuration uses the Transport Control Protocol/Internet Protocol ("TCP/IP") network protocol suite, however, other Internet Protocol based networks are contemplated by the present disclosure. Communications may also include IP tunneling protocols such as those that allow virtual private networks coupling multiple intranets or extranets together via the Internet. The network 120 may support existing or envisioned application protocols, such as, for example, telnet, POP3, Mime, HTTP, HTTPS, PPP, TCP/IP, SMTP, proprietary protocols, or any other network protocols. During operation, the IED 110 may communicate using the network 120 as will be hereinafter discussed.

It is to be appreciated that are at least two basic types of networks, based on the communication patterns between the machines: client/server networks and peer-to-peer networks. On a client/server network, every computer, device or IED has a distinct role: that of either a client or a server. A server is designed to share its resources among the client computers on the network. A dedicated server computer often has faster processors, more memory, and more storage space than a client because it might have to service dozens or even hundreds of users at the same time. High-performance servers typically use from two to eight processors (and that's not counting multi-core CPUs), have many gigabytes of memory installed, and have one or more server-optimized network interface cards (NICs), RAID (Redundant Array of Independent Drives) storage consisting of multiple drives, and redundant power supplies. Servers often run a special network OS—such as Windows Server, Linux, or UNIX—that is designed solely to facilitate the sharing of its resources. These resources can reside on a single server or on a group of servers. When more than one server is used, each server can "specialize" in a particular task (file server, print server, fax server, email server, and so on) or provide redundancy (duplicate servers) in case of server failure. For demanding computing tasks, several servers can act as a single unit through the use of parallel processing. A client device typically communicates only with servers, not with other clients. A client system is a standard PC that is running an OS such as Windows. Current OSes contain client software that enables the client computers to access the resources that servers share. Older OSes, such as Windows 3.x and DOS, required add-on network client software to join a network. By contrast, on a peer-to-peer network, every computer or device is equal and can communicate with any other computer or device on the network to which it has been granted access rights. Essentially, every computer or device on a peer-to-peer network can function as both a server and a client; any computer or device on a peer-to-peer network is considered a server if it shares a printer, a folder, a drive, or some other resource with the rest of the network. Note that the actual networking hardware (interface cards, cables, and so on) is the same in client/server versus peer-to-peer networks, it is only the logical organization, management and control of the network that varies.

The PC client 102 may comprise any computing device, such as a server, mainframe, workstation, personal computer, hand held computer, laptop telephony device, network appliance, other IED, Programmable Logic Controller, Power Meter, Protective Relay etc. The PC client 102 includes system memory 104, which may be implemented in volatile and/or non-volatile devices. One or more client applications 106 which may execute in the system memory 104 is provided. Such client applications may include, for example, FTP client applications. File Transfer Protocol (FTP) is an application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". Additionally, user interfaces 108 may be included for displaying system configuration, retrieved data and diagnostics associated with the IED 110.

The intelligent electronic device (IED) 110, in one embodiment, is comprised of at least an FTP Server 131 including a Virtual Command File Processor 133, a File System and Driver 135, a non-volatile memory 137 and a virtual data store 139. Of course, the IED 110 may contain other hardware/software for performing functions associated with the IED, however, these functions are not relevant to the present application and will therefore not be further discussed.

IED 110 runs the FTP Server 131 as an independent process in the operating system, allowing it to function independently of the other running processes. Additionally, it allows for multiple connections, using the port/socket architecture of TCP/IP.

By running the FTP Server 131 as an independent process, this means that other systems, such as a Modbus TCP handler, can run on IED 110 concurrently with the FTP Server 131. This also means that multiple FTP connections can be made with the only limitation being the system's available resources.

The FTP Server 131 provides access to the file system 135 of the IED 110 on the standard FTP port (port 21). When a connection is made, PC client 102 sends a FTP logon sequence, which includes a USER command and a PASS command. The PC client 102 then interacts with the IED 110, requesting information and writing files, ending in a logout.

The FTP Server 131 uses two ports for all actions. The first port 21, is a clear ASCII telnet channel, and is called the command channel. The second port, which can have a different port number in different applications, is initiated whenever it is necessary to transfer data in clear binary, and is called the data channel.

The virtual data store 139 is an ideal storage medium for files that are written to very frequently, such as, for example, status information, diagnostics, and virtual command files. In contrast to these types of files are files which require more long term storage, such as, for example, Logs, settings, and configuration, a more suitable to be stored using a compact flash drive.

The File Transfer Protocol (FTP) (Port 21) is a network protocol used to transfer data from one computer to another through a network, such as over the Internet. FTP is a commonly used protocol for exchanging files over any TCP/IP based network to manipulate files on another computer on that network regardless of which operating systems are involved (if the computers permit FTP access). There are many existing FTP client and server programs. FTP servers can be set up anywhere between game servers, voice servers, internet hosts, and other physical servers.

FTP runs exclusively over TCP. FTP servers by default listen on port 21 for incoming connections from FTP clients. A connection to this port from the FTP Client forms the control stream on which commands are passed to the FTP server from the FTP client and on occasion from the FTP server to the FTP client. FTP uses out-of-band control, which means it uses a separate connection for control and data. Thus, for the actual file transfer to take place, a different connection is required which is called the data stream. Depending on the transfer mode, the process of setting up the data stream is different.

In active mode, the FTP client opens a dynamic port (49152-65535), sends the FTP server the dynamic port number on which it is listening over the control stream and waits for a connection from the FTP server. When the FTP server initiates the data connection to the FTP client it binds the source port to port 20 on the FTP server.

To use active mode, the client sends a PORT command, with the IP and port as argument. The format for the IP and port is "h1,h2,h3,h4,p1,p2". Each field is a decimal representation of 8 bits of the host IP, followed by the chosen data port. For example, a client with an IP of 192.168.0.1, listening on port 49154 for the data connection will send the command "PORT 192,168,0,1,192,2". The port fields should be interpreted as p1×256+p2=port, or, in this example, 192×256+2=49154.

In passive mode, the FTP server opens a dynamic port (49152-65535), sends the FTP client the server's IP address to connect to and the port on which it is listening (a 16 bit value broken into a high and low byte, like explained before) over the control stream and waits for a connection from the FTP client. In this case the FTP client binds the source port of the connection to a dynamic port between 49152 and 65535.

To use passive mode, the client sends the PASV command to which the server would reply with something similar to "227 Entering Passive Mode (127,0,0,1,192,52)". The syntax of the IP address and port are the same as for the argument to the PORT command.

In extended passive mode, the FTP server operates exactly the same as passive mode, however it only transmits the port number (not broken into high and low bytes) and the client is to assume that it connects to the same IP address that was originally connected to.

The objectives of FTP are to promote sharing of files (computer programs and/or data), to encourage indirect or implicit use of remote computers, to shield a user from variations in file storage systems among different hosts and to transfer data reliably, and efficiently.

In one embodiment of the present disclosure, the IED 110 has the ability to provide an external PC client 102 with an improved data transfer rate when making data download requests of data stored within an IED. This is achieved by configuring the IED 110 to include an FTP server 131 including a Virtual Command File Processor 133. An improved data transfer rate from the IED 110 may be realized by the external PC client 102 issuing virtual commands to the IED 110. In response, the IED 110 processes the received virtual commands in the Virtual Command File processor 133 to construct FTP commands therefrom to be applied to a novel file system 135 of the IED 110, coupled to the FTP server 131, wherein the novel file system 135 is configured as a PC file structure amenable to receiving and responding to the constructed FTP commands. The Virtual command files and the novel file system 135 are discussed in greater detail in co-pending application Ser. No. 12/061,979.

While FTP file transfer comprises one embodiment for encapsulating files to improve a data transfer rate from an IED to external PC clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example. Such a system is described in a co-owned U.S. Pat. No. 6,751,563, titled "Electronic Energy meter", the contents of which are incorporated herein by reference. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages.

Figure 4:
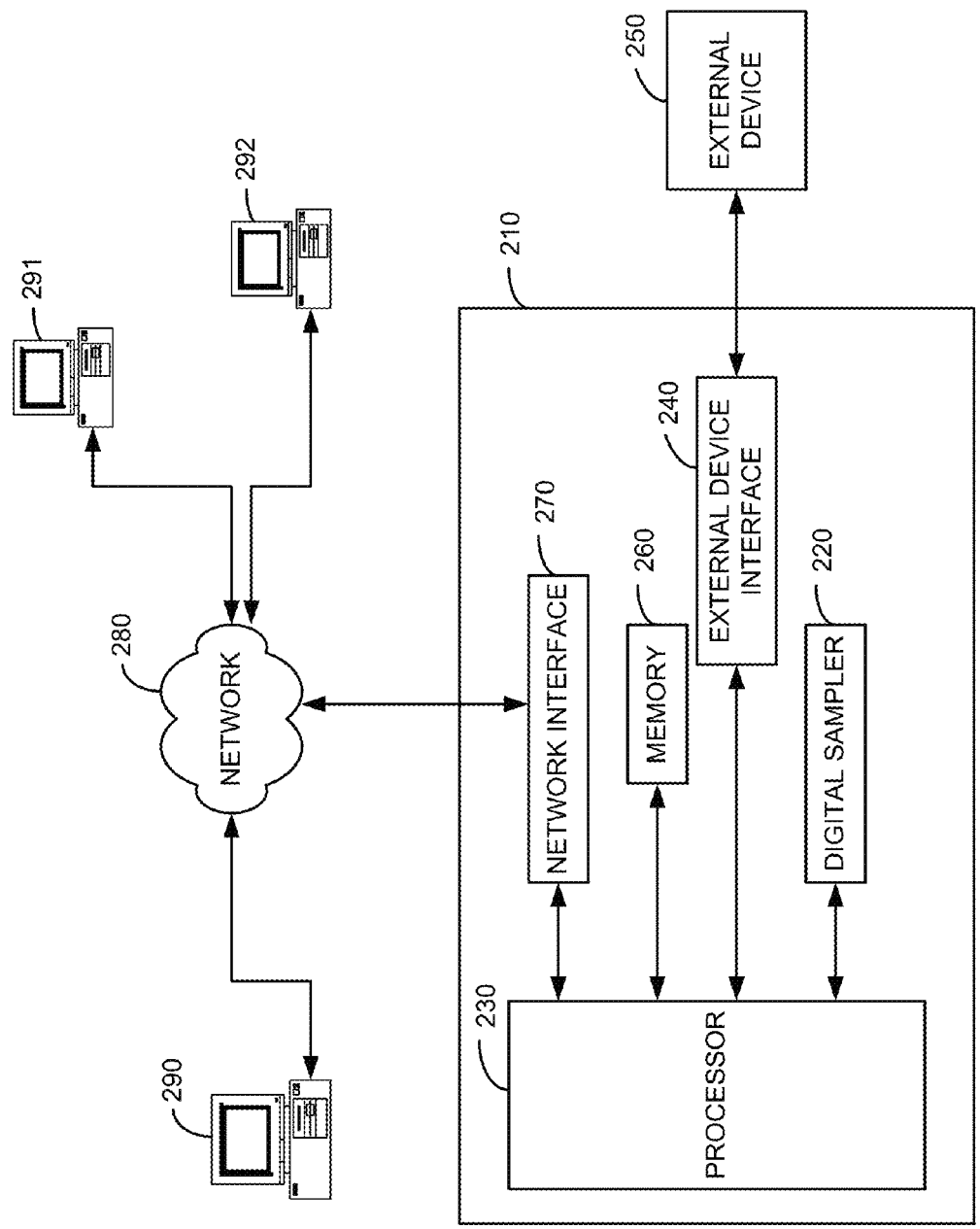
FIG. 4 is a block diagram of a web server power quality and revenue meter, according to an embodiment of the present disclosure.

Portions of U.S. Pat. No. 6,751,563 will be reproduced here. FIG. 4 is a block diagram of a web server power quality and revenue meter 210. The meter is connected to monitor electric distribution power lines (not shown), to monitor voltage and current at the point of connection. Included therein is digital sampler 220 for digitally sampling the voltage and current of the power being supplied to a customer or monitored at the point of the series connection in the power grid. Digital sampler 220 digitally samples the voltage and current and performs substantially similar to the A/D converters 14 described above in relation to FIG. 1. The digital samples are then forwarded to processor 230 for processing. It is to be appreciated that the processor may be a single processing unit or a processing assembly including at least one CPU 50, DSP1 60, DSP2 70 and FPGA 80, or any combination thereof. Also connected to processor 230 is external device interface 240 for providing an interface for external devices 250 to connect to meter 210. These external devices might include other power meters, sub-station control circuitry, on/off switches, etc. Processor 230 receives data packets from digital sampler 220 and external devices 250, and processes the data packets according to user defined or predefined requirements. A memory 260 is connected to processor 230 for storing data packets and program algorithms, and to assist in processing functions of processor 230. These processing functions include the power quality data and revenue calculations, as well as formatting data into different protocols which will be described later in detail. Processor 130 provides processed data to network 280 through network interface 270. Network 280 can be the Internet, the World Wide Web (WWW), an intranet, a wide area network (WAN), or local area network (LAN), among others. In one embodiment, the network interface converts the data to an Ethernet TCP/IP format. The use of the Ethernet TCP/IP format allows multiple users to access the power meter simultaneously. In a like fashion, network interface 270 might be comprised of a modem, cable connection, or other devices that provide formatting functions. Computers 290-292 are shown connected to network 280.

A web server program (web server) is contained in memory 260, and accessed through network interface 270. The web server provides real time data through any known web server interface format. For example, popular web server interface formats consist of HTML and XML formats. The actual format of the programming language used is not essential to the present disclosure, in that any web server format can be incorporated herein. The web server provides a user friendly interface for the user to interact with the meter 210. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The processor 230 formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 290-292 through network 280, that connects to meter 210 at the network interface 270. In one embodiment, network interface 270 is an Ethernet interface that supports, for example, 100 base-T or 10 base-T communications. This type of network interface can send and receive data packets between WAN connections and/or LAN connections and the meter 210. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 5:
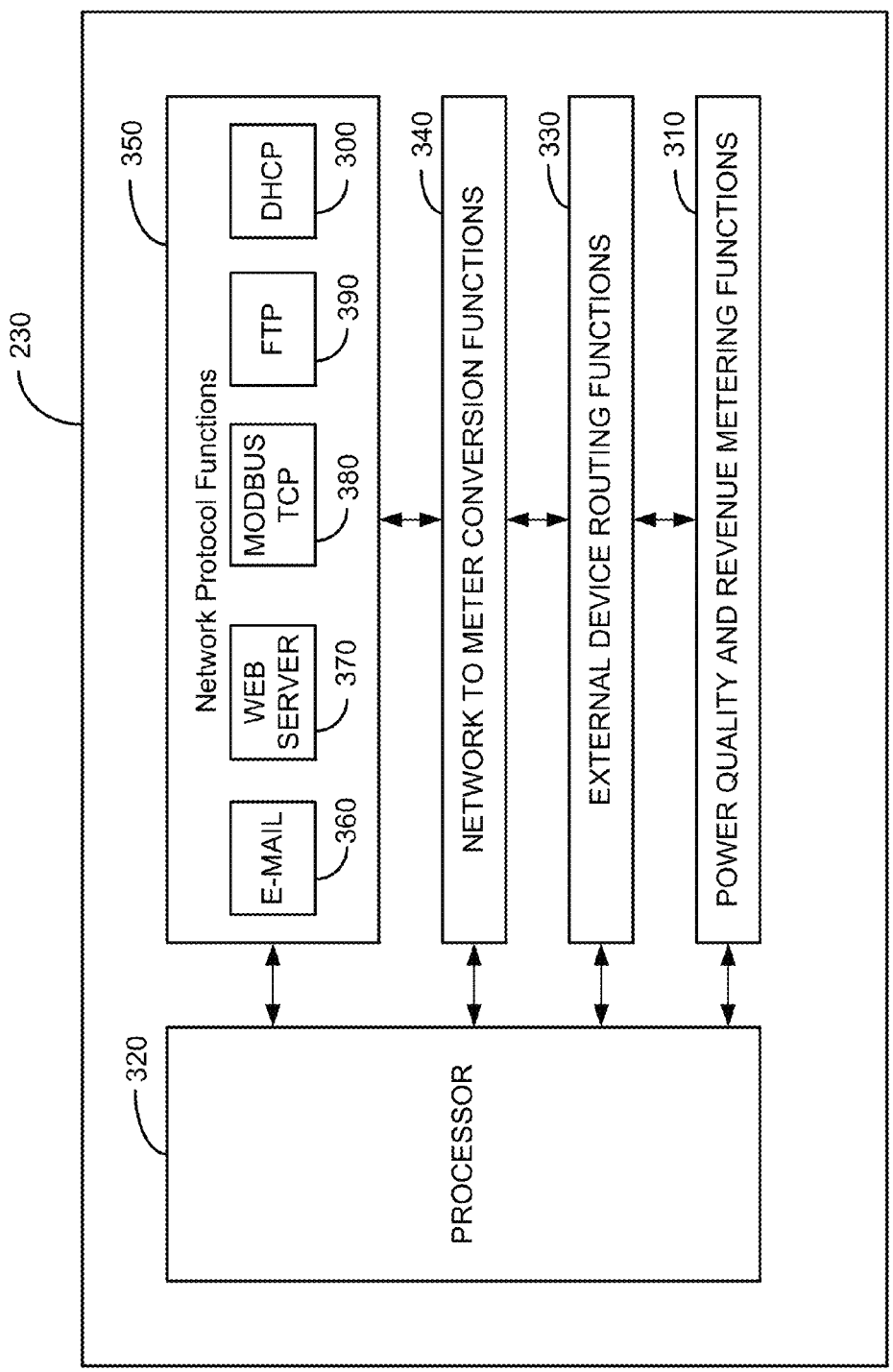
FIG. 5 is a functional block diagram of the processor of the web server power quality and revenue meter system shown in FIG. 4, according to the embodiment of the present invention.

FIG. 5 is a functional block diagram of processor 230 of the web server power quality and revenue meter system according to the embodiment of the present invention. Processor 230 is shown containing four main processing functions. The functions shown are illustrative and not meant to be inclusive of all possible functions performed by processor 230. Power Quality and Revenue Metering functions (metering functions) 310 consists of a complete set of functions which are needed for power quality and revenue metering. Packet data collected by digital sampler 220 is transmitted to processor 230. Processor 230 calculates, for example, power reactive power, apparent power, and power factor. The metering function 310 responds to commands via the network or other interfaces supported by the meter. External Device Routing Functions 330 handle the interfacing between the external device 250 and meter 210. Raw data from external device 250 is fed into meter 210. The external device 250 is assigned a particular address. If more than one external device is connected to meter 210, each device will be assigned a unique particular address. The Network Protocol Functions 350 of meter 210 are executed by processor 230 which executes multiple networking tasks that are running concurrently. As shown in FIG. 5, these include, but are not limited to, the following network tasks included in network protocol functions 350: e-mail 360, web server 370, Modbus TCP 380, FTP 390, and DHCP 300. The e-mail 360 network protocol function can be utilized to send e-mail messages via the network 280 to a user to, for example, notify the user of an emergency situation or if the power consumption reaches a user-set or pre-set high level threshold. As the processor receives packets of data it identifies the network processing necessary for the packet by the port number associated with the packet. The processor allocates the packet to a task as a function of the port number. Since each task is running independently the meter 210 can accept different types of requests concurrently and process them transparently from each other. For example, the web server may be accessed by one user while another user is communicating via Modbus TCP and at the same time a third user may download a log file via FTP. The Network to Meter Protocol Conversion Function 340 is used to format and protocol convert the different network protocol messages to a common format understood by the other functional sections of meter 210. After the basic network processing of the packet of data, any "commands" or data which are to be passed to other functional sections of meter 210 are formatted and protocol converted to a common format for processing by the Network to Meter Protocol Conversion Function 340. Similarly, commands or data coming from the meter for transfer over the network are pre-processed by this function into the proper format before being sent to the appropriate network task for transmission over the network. In addition this function first protocol converts and then routes data and commands between the meter and external devices.

As described above, intelligent electronic devices (IEDS), including power metering devices, have the need to record information that is retained when the device loses main power. The operating program, configuration data and collected information, among other types of information, all have a need to be maintained by the IED. Conventionally, a battery backup device has been employed to maintain power to a memory holding such data. However, including a battery backup device adds costs to the IED and requires space in an already tightly packed housing of the IED. Additionally, the battery needs to be maintained/replaced over time, e.g., a battery no longer holding a charge needs to be replaced. Moreover, replacing the battery will require a meter, i.e., an IED, to be removed from service. This often will cause a loss of measurement data recording and inaccuracies as meter data is not recording when the battery is being serviced. Also, being that even if the meter is designed so that the battery can be serviced in a manner wherein the meter remains live, it is dangerous to electrically connect a user to the meter where high voltage can be running through the meter.

Furthermore, prior art IED typically store data calculated in a processing unit form volatile memory to a non-volatile memory after a predetermined period of time, e.g., approximately 1 minute. This predetermined period of time is relatively large due to several factors. For example, certain types of non-volatile memory (e.g., FLASH memory) have a limit to the number of times data can be erased and/or written to the memory. The shorter the write cycle, the more writes are completed to the memory risking the memory being "worn out". Such issues are detailed in commonly owned U.S. patent application Ser. No. 11/965,798, the contents of which are incorporated by reference in its entirety. Additionally, the write cycle to such memories require a 2 step process (i.e., an erase then write), which complicates the firmware slowing down the IED if run too often. Therefore, the write cycle to such memories is programmed to be relatively large. This relatively large write cycle increases the risk of data loss. For example, if a power loss to the IED occurs fifty-five (55) seconds after the last save, the fifty-five seconds of data will be lost.

By employing a memory structure in accordance with the present disclosure, the intelligent electronic device 10 stores data with at least two different rates on two different types of memory. A first memory 20 has a large capacity for long term storage, e.g., a FLASH memory. While suitable for storing large amounts of data, the first memory has a complicated write sequence which incurs delays making it unsuitable for storing data on a power loss. The second memory 21 is configured for faster write performance and a much greater maximum number of write-erase cycles, while not requiring a battery to retain data. Due to the faster write performance and large number of write-erase cycles, the second memory 21 can store data more rapidly than the first memory with no regard for the second memory wearing out. In this manner, the second memory stores data at a faster rate (e.g., up to 300 times faster) than the first memory making it more suitable for storing data in the event of a power loss.

An exemplary memory having these characteristics is a ferroelectric random access memory (FRAM) such as the FRAM memory model MB85R256F, commercially available from Fujitsu Semiconductor Limited of Japan. Such as FRAM memory is able to retain data without using a battery back-up and can be used for at least $10^{10}$ read/write operations (i.e., at least 10 billion read/write operations), which is significant improvement over the number of read and write operations supported by FLASH memory and EEPROMs. Furthermore, such a FRAM memory retains the data stored thereon for at least 10 years. Other exemplary FRAM memories can be used for at least $10^{14}$ read/write operations (i.e., at least 100 trillion read/write operations), e.g., Model FM25V20.

Rather than storing the memory states using the presence or absence of charge stored to a capacitor, FRAM memory encodes one of two orientations of magnetic dipoles in the crystal structure of a ferroelectric material. Once oriented, power no longer needs to be applied to maintain the magnetic orientation. As with an EEPROM or NVRAM, (but not FLASH), individual bytes in a FRAM can be changed at any time, independent of the values of the other bytes in the memory. As with an NVRAM (but not an EEPROM or FLASH), there are no significant delays for either erasing or writing to a FRAM. As opposed to FLASH, and to a lesser degree EEPROMs, since there is no concerns over writing or erasing in sequences or pages, there is no need to write complicated code for managing the erasing or writing of blocks of memory larger than EEPROMs short multi-byte runs or FLASHes pages. As opposed to an NVRAM (but similar to an EEPROM or FLASH), FRAM is not limited in the duration of it's non-volatile storage, as it does not require a battery to maintain its information. And lastly, as opposed to NVRAM, there is no need for the space concerns of external or internal batteries, having chip sizes similar to FLASH or EEPROMs.

Consider an IED that needs to store periodic information using the above types of memory. For example, assume a device updates 256 bytes of data periodically, and needs to save it in non-volatile memory so that the most recent set of information can be accessed after a power loss.

In all cases, it is necessary to write successive new blocks of 256 bytes to at least a pair of alternating locations, as the processing unit can not be altering the last stored block when saving your newest block, in case power is lost while writing the new block preventing its complete storage. With at least alternating blocks, an incomplete storage of the current block still leaves an unaltered previous block for use.

EEPROM

With an EEPROM, a single byte can be written with little effort, a single write instruction using a single address and a single value, but the EEPROM requires time after writing each byte, so before writing the next byte, a program must either wait the maximum delay time for a byte write, or need to run code to look for the signal from the EEPROM that the write has completed. As an example, an AT28C64B EEPROM will take a maximum of 10 ms to complete a write. To write 256 bytes individually would require waiting 10 ms 256 times, for a total of 2.56 seconds.

Here is a sample code for writing to an EEPROM (this example comes from a serial EEPROM, which requires a few extra steps not mentioned above, and is written in an assembly language):

Relevant to our discussion is the final section starting with the label "PAGE_WR_LOOP". The first four instructions loop through writing a page of bytes, in this case a page of 16 bytes, after which the routine "wait_10 ms" is invoked causing the program to wait the 10 ms for the EEPROM to finish the storage.

NVRAM

Using NVRAM, writing our 256 bytes can be accomplished as simply as running a loop to perform 256 write instructions, running through the 256 intended addresses and using the 256 new values.

Here is a sample code for writing to an NVRAM (this example is written in C):

NVRAM.s_Page_SOE_SS_Log.u.Snapshot_256[Dynamic.index % (NVRAM_Page/256)]=Exception_Snapshot.Snapshot_256;

Since NVRAM is essentially RAM, no special handling is needed. The above example is copying data structure that is 256 bytes in size (Snapshot_256) from a location in RAM (Exception_Snapshot) to a location in NVRAM (NVRAM.s.Page_SOE_SS_LOG.u) simply by using the equate operation ('='), for which the system will simply execute a loop that copies 256 bytes.

FLASH

With a FLASH, operation is similar to an EEPROM, with the added complication that the processing unit must first erase a sector of FLASH before bytes can be written to that sector. A command must be sent to the FLASH, usually a sequence of several specific write of certain values to certain addresses, to tell the FLASH that a particular sector needs to be erased, after which the program must wait for the maximum delay for erasing or run code to look for the signal from the FLASH that the erase has completed. As an example, an AM29F010B FLASH will typically take 1 second to erase a sector. As a sector on this chip is 16 k, and our example is 256 byte blocks, the processing unit can save 64 blocks per sector, and so if the processing unit uses 2 sectors, the processing unit would only have to erase a sector

```
;----------
PAGE_WRITE:
;----------
; It write a page, 16 bytes, pointed by BX to eeprom.
;
; AL     - block address
; AH     - byte address
; BX     - points to the page
; DL     - byte
; CL,CH,DH - working register
page_size  equ  16
        CALL  EEP_START         ; initialize block address and set for
                                ; write operation
        LDB   CH,AL
        SHLB  CH,#1
        ORB   CH,#WR_CMD_EEP
        CALL  EEP_TXD
        CALL  EEP_ACK
;       JBS   SYS4_F,wr_ee_busy,PAGE_WRITE ; if eeprom is in previous write
cycle then
                                ; repeat the initialization
        LDB   CH,AH             ;set byte address
        CALL  EEP_TXD
        CALL  EEP_ACK
        LDB   DH,#page_size ; write page
PAGE_WR_LOOP:
        LDB   CH,[BX]+
        CALL  EEP_TXD
        CALL  EEP_ACK
        DJNZ  DH,PAGE_WR_LOOP
        CALL  EEP_STOP
        call  wait_10ms
        RET
``` every 64 storages, but every 64 storages the processing unit would have a typical 1 second delay from interacting with this flash. After dealing with the erasing, operation with the FLASH would be similar to the EEPROM. For the AM29F010B, to write 256 bytes requires waiting typically 14 μs 256 times, for a total of typically about 3.6 msec.

Here is a sample code for erasing a FLASH (this example is written in an assembly language):

```
; SUBROUTINE TO ERASE FLASH SECTOR (RANGE C0000H - DFFFH IN 16K BLOCKS). PASS
; FAIL FLAG SET ON STATUS OF OPERATION. LEAVE SECTOR NUMBER (0 - 7) IN BX
FLES
      LCALL    FLRES
      ANDB     FL__FL,#LOW (BINNOT (001H SHL FLASH_ST))
      LD   AX,#4000H                        ;SECTOR SIZE
      MUL  AX,BX                            ;SECTOR BASE ADDRESS
      ADD  BX,#0CH                          ;SECTOR SEGMENT IN MEMORY
      ST   AX,BASE0
      ST   BX,BASE0+2
      LD   AX,#55AAH            ;RESPONSES
      LD   BX,#8030H
      ESTB     AXL,0C5555H[ZERO_REG]    ;1ST CYCLE 0AAH TO 5555H
      ESTB     AXH,0C2AAAH[ZERO_REG]    ;2ND CYCLE 55H TO 2AAAH
      ESTB     BXH,0C5555H[ZERO_REG]    ;3RD CYCLE 80H TO 5555H
      ESTB     AXL,0C5555H[ZERO_REG]    ;4TH CYCLE 0AAH TO 5555H
      ESTB     AXH,0C2AAAH[ZERO_REG]    ;5TH CYCLE 55H TO 2AAAH
      ESTB     BXL,[BASE0]              ;6TH CYCLE 30H TO SECTOR ADDRESS
      NOP
      NOP
FLES2
      ELDB     AXL,[BASE0]       ; TOGGLE POLL
FLES_LOOP:
      STB      AXL,BXH           ; PREVIOUS TO BXH FOR XOR TO DETECT DQ6 TOGGLE
      STB      AXL,AXH           ; PREVIOUS TO AXH TO TEST PREVIOUS DQ5 FOR ERROR
      ELDB     AXL,[BASE0]
      XORB     BXH,AXL
      JBC      BXH,6,FLES1       ; IF DQ6 CONSTANT, PASS AND EXIT
      JBC      AXH,5,FLES_LOOP   ; IF DQ6 TOGGLE, AND PREVIOUS DQ5 SHOWS NO ERROR, RETRY
                                 ; IF DQ6 TOGGLE, AND PREVIOUS DQ5 SHOWS ERROR, FAIL
      ORB      FL__FL,#LOW (001H SHL FLASH_ST)
FLES1:
      LCALL    FLRES
      RET
```

Relevant to this discussion, the first section between the labels FLES and FLES2 is the command sent to erase a sector. Between the labels FLES2 and FLES1, this program is running code to look for the signal from the FLASH that the erase has completed Here is a sample code for writing to a FLASH (this example is also written in an assembly language):

```
; SUBROUTINE TO PROGRAM BYTE TO FLASH (BASE RANGE C0000 - DFFFF). LEAVE BYTE ADDRESS
; IN BASE0, BYTE IN AL. PASS/FAIL (0/1) FLAG SET.
FLPB
      LCALL    FLRES
      ANDB FL__FL,#LOW (BINNOT (001H SHL FLASH_ST))
      LD   BX,#55AAH            ;RESPONSES
      ESTB     BXL,0C5555H[ZERO_REG]    ;1ST CYCLE 0A0H TO 5555
      ESTB     BXH,0C2AAAH[ZERO_REG]    ;2ND CYCLE 55H TO 2AAAH
      LDB      BXH,#0A0H
      ESTB     BXH,0C5555H[ZERO_REG]    ;3RD CYCLE 0A0H TO 5555H
TST2  ESTB     AXL,[BASE0]              ;4TH CYCLE WRITE DATA
      NOP
      NOP
      ELDB     AXL,[BASE0]       ; TOGGLE POLL
FLPB_LOOP:
      STB      AXL,BXH           ; PREVIOUS TO BXH FOR XOR TO DETECT DQ6 TOGGLE
      STB      AXL,AXH           ; PREVIOUS TO AXH TO TEST PREVIOUS DQ5 FOR ERROR
      ELDB     AXL,[BASE0]
      XORB     BXH,AXL
```

```
    JBC    BXH,6,FLPB1          ; IF DQ6 CONSTANT, PASS AND EXIT
    JBC    AXH,5,FLPB_LOOP      ; IF DQ6 TOGGLE, AND PREVIOUS DQ5
SHOWS NO ERROR, RETRY
                                ; IF DQ6 TOGGLE, AND PREVIOUS DQ5 SHOWS
ERROR, FAIL
    ORB    FL_FL,#LOW (001H SHL FLASH_ST)
FLPB1:
    LCALL  FLRES                ;RESET/READ
    RET
```

Relevant to our discussion, the first section between the labels FLPB and TST2 is the command to write a byte. Between the labels TST2 and FLPB1, this program is running code to look for the signal from the FLASH that the byte write has completed

FRAM

Using FRAM, writing 256 bytes can be accomplished as simply as running a loop to perform 256 write instructions, running through the 256 intended addresses and using 256 new values.

Here is a sample code for writing to an FRAM (this example is written in an assembly language):

```
LD      TMPTR1, #LSW (FB0_END_INDEX)    ;FROM PTR
LD      TMPTR2, #MSW (FB0_END_INDEX)
LD      TEMP1,#LSW (FB01_SEQ_END)       ;TO PTR
LD      TEMP2,#MSW (FB01_SEQ_END)
LD      BASE0,#((254 + 2)/2 ;NO BYTES + CKSUM
EBMOVI         TMPTR1, BASE0
```

Since FRAM is accessed the same as RAM, no special handling is needed whatsoever. The above example is copying a block of data 256 bytes long (254+2) from a location in RAM (FB0_END_INDEX) to a location in FRAM (FB01_SEQ_END) simply by using the a memory move instruction (EBMOVI), for which the processor will copy the 256 bytes automatically. Therefore, by employing a FRAM memory in the IED of the present disclosure, data can be stored in a simple one-step write process with out the need of an erase step.

Figure 6A:
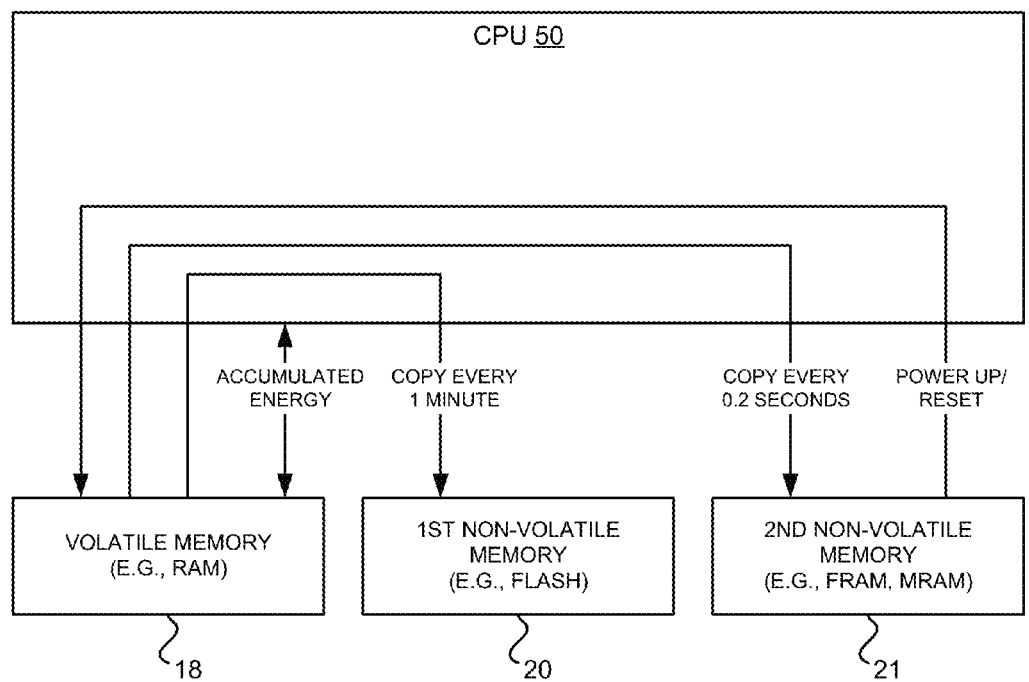
FIG. 6A is an exemplary memory structure for preventing data loss upon loss of power in accordance with an embodiment of the present disclosure.
Figure 6B:
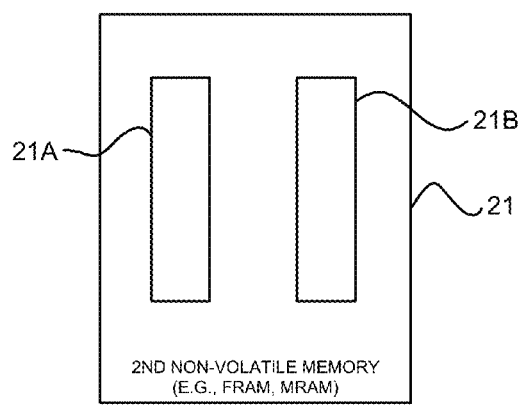
FIG. 6B is a block diagram of a memory in accordance with an embodiment of the present disclosure.
Figure 7:
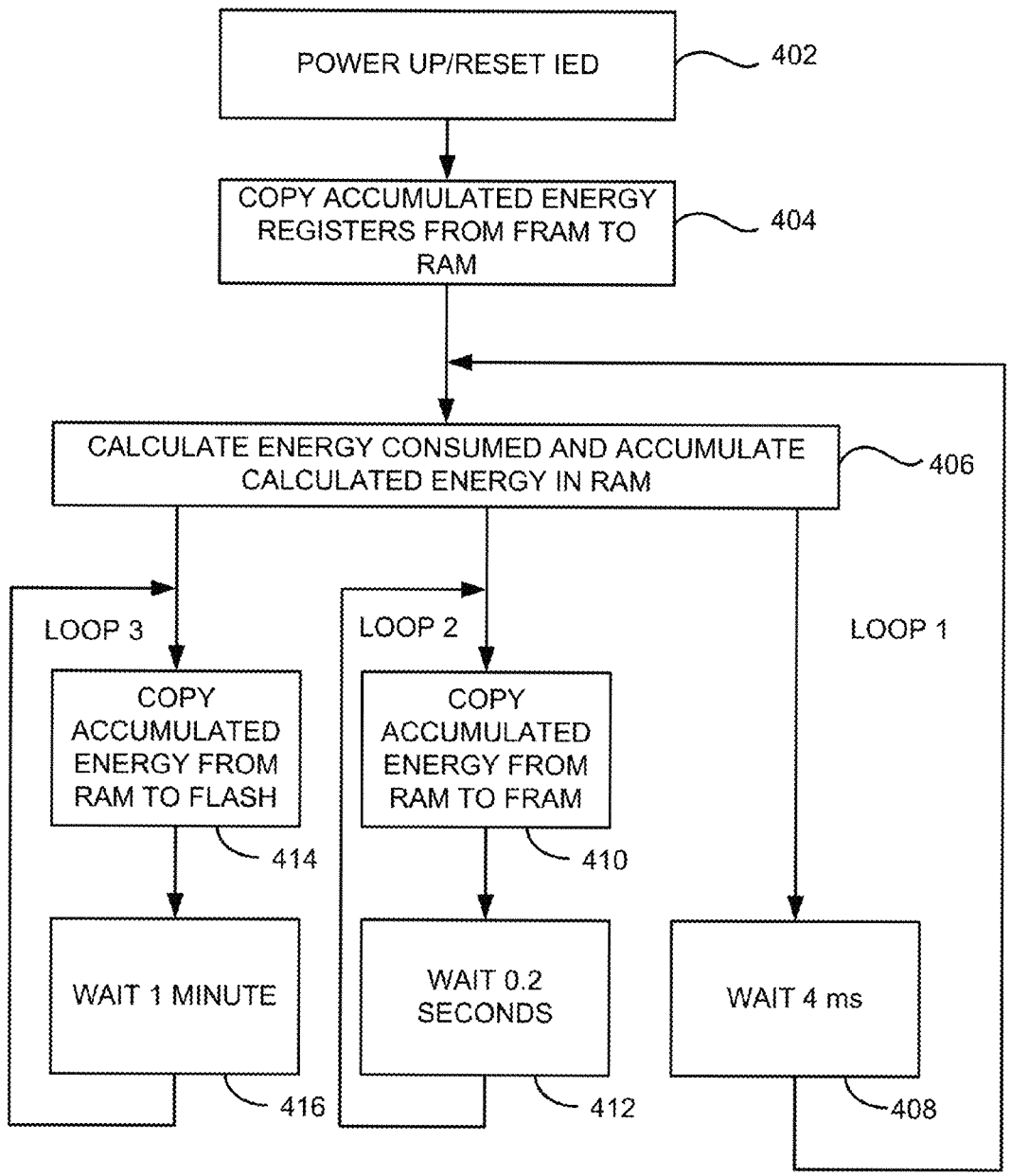
FIG. 7 is a flowchart illustrating an exemplary method for preventing data loss upon loss of power in accordance with an embodiment of the present disclosure.

Referring to FIGS. 6A, 6B and 7, the memory structure and method thereof in accordance with at least one embodiment of the present disclosure will now be described.

In step 402, the IED is either powered up from an off state or powered up after a reset. The reset may be due to several conditions including, but not limited to, a manual reset, a power loss, etc. In step 404, the processing unit 50 copies accumulated energy registers from the second non-volatile memory 21 to the volatile memory 18. As will be explained further below, since the data is copied from the volatile memory 18 to the second non-volatile memory 21 during normal operations at a relatively fast interval (e.g., 0.2 seconds), this will restore the values of the energy registers in the volatile memory 18 to a state or similar value just prior to the power loss.

In step 406, the processing unit 50 calculates energy consumed by at least one load and accumulates the energy in the volatile memory 18. The processing unit 50 repeats the calculation and accumulation at a predetermined interval, e.g., about 4 millisecond, step 408. It is to be appreciated that this interval may be adjustable. For example, the predetermined interval for Loop 1 shown in FIG. 7 may be any value from about 1 millisecond to about 100 milliseconds.

In step 410, the processing unit 50 copies the accumulated energy from the volatile memory 18 to the second non-volatile memory 21 at a predetermined interval, e.g., about 0.2 seconds. It is to be appreciated that the predetermined interval 412 may be adjustable, e.g., from about 10 milliseconds to about 10 seconds. Due to the one-step write cycle, the predetermined interval can be set at about 0.2 seconds or less. Additionally, due to the high number of read-write operations, e.g., on the order of $10^{10}$ operations, there is no concern of the second non-volatile memory wearing out due to the high sample rate.

It is further to be appreciated that the processing unit 50 copies or writes successive new blocks of bytes to at least a pair of alternating locations in the second non-volatile memory 21, e.g., buffer 21A and buffer 21B as shown in FIG. 6B, as the processing unit 50 can not be altering the last stored block when saving the newest block, in case power is lost while writing the new block preventing its complete storage. With at least alternating blocks, an incomplete storage of the current block still leaves an unaltered previous block for use.

In step 414, the processing unit 50 copies the accumulated energy from the volatile memory 18 to the first non-volatile memory 20 for long term storage and retrieval by another device. The processing unit 50 copies the energy to the first non-volatile memory 20 approximately every 1 minute, step 416, although this interval may be adjustable. For example, the predetermined interval for Loop 3 shown in FIG. 7 may be any value from about 1 second to about 10 minutes.

It is to be appreciated that the process loops 1, 2, and 3 may programmed (or implemented in firmware) independently while executed simultaneously or near-simultaneously.

By employing a memory structure as shown in FIG. 6A in accordance with the present disclosure, the intelligent electronic device 10 stores data with at least two different rates on two different types of memory to avoid loss of data upon a power loss or reset of the IED 10. For example, since the accumulated energy is copied from the volatile memory 18 to the second non-volatile memory 21 every predetermined interval of, for example, 0.2 seconds, only 0.2 seconds of accumulate energy data just prior to the power loss will be lost; in contrast to prior art IEDs, that potentially could lose up to 1 minute of data, as described in the example above.

It is further to be appreciated that the techniques of the present disclosure are enable by a non-volatile memory that requires no battery-backup for retaining data, can be written to by a single-cycle write; has a large number of read-write operations, for example, on the order of $10^{10}$ operations; and does not require a refresh. Therefore, the IED of the present disclosure may employ other memories having at least similar characteristics, such as a magnetroresistive random access memory (MRAM). Similar to a FRAM memory, a MRAM memory stores data by magnetic storage elements and not as electric charge or current flows.

It is to be appreciated that the various features shown and described are interchangeable, that is a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An intelligent electronic device comprising:
   at least one sensor configured for sensing at least one electrical parameter distributed to a load;
   at least one analog-to-digital converter coupled to the at least one sensor and configured for converting an analog signal output from the at least one sensor to a digital data; and
   a processing unit coupled to the at least one analog-to-digital converter configured to receive the digital data, calculate energy consumed by the load and accumulate the calculated energy in a first volatile memory;
   the processing unit being configured to iteratively copy the accumulated energy from the first volatile memory to a first non-volatile memory after a first predetermined time period and iteratively copy the accumulated energy from the first volatile memory to a second non-volatile memory after a second predetermined time period, wherein the first predetermined time period is longer than the second predetermined time period, and wherein the second non-volatile memory is configured to retain the accumulated energy in a power loss without use of a battery and is configured to be written to by a single-cycle write.

2. The device of claim 1, wherein the processing unit is further configured to copy the accumulated energy from the second non-volatile memory to the first volatile memory upon a power up of the intelligent electronic device after a power loss or reset of the intelligent electronic device such that contents of the first volatile memory are restored to a similar state just prior to the power loss or reset.

3. The device as in claim 2, wherein the first non-volatile memory is a flash memory.

4. The device as in claim 3, wherein the second non-volatile memory is a ferroelectric random access memory (FRAM).

5. The device as in claim 3, wherein the second non-volatile memory is a magnetoresistive random access memory (MRAM).

6. The device as in claim 2, wherein the first non-volatile memory is removable.

7. The device as in claim 2, wherein the first predetermined time period is about one minute.

8. The device as in claim 7, wherein the second predetermined time period is about 0.2 seconds.

9. The device as in claim 1, further comprising a housing.

10. The device as in claim 9, wherein the housing is at least one of a socket-based housing, an A-based housing, a panel meter housing and a switchboard meter housing.

11. The device as in claim 1, wherein the second non-volatile memory includes at least 10 billion read/write operations.

12. The device in claim 1, wherein the second non-volatile memory can retain the accumulated energy for at least 10 years.

13. A method for preventing loss of data in an intelligent electronic device, the method comprising:
   sensing at least one electrical parameter distributed to a load;
   converting an analog signal output from the at least one sensor to a digital data;
   calculating energy consumed by the load and accumulating the calculated energy in a first volatile memory;
   iteratively copying the accumulated energy from the first volatile memory to a first non-volatile memory after a first predetermined time period; and
   iteratively copying the accumulated energy from the first volatile memory to a second non-volatile memory after a second predetermined time period, wherein the first predetermined time period is longer than the second predetermined time period, and wherein the second non-volatile memory is configured to retain the accumulated energy in a power loss without use of a battery and is configured to be written to by a single-cycle write.

14. The method of claim 13, further comprising copying the accumulated energy from the second non-volatile memory to the first volatile memory upon a power up of the intelligent electronic device after a power loss or reset of the intelligent electronic device such that contents of the first volatile memory are restored to a similar state just prior to the power loss or reset.

15. The method as in claim 14, wherein the first non-volatile memory is a flash memory.

16. The method as in claim 15, wherein the second non-volatile memory is a ferroelectric random access memory (FRAM).

17. The method as in claim 15, wherein the second non-volatile memory is a magnetoresistive random access memory (MRAM).

18. The method as in claim 14, wherein the first non-volatile memory is removable.

19. The method as in claim 14, wherein the first predetermined time period is about one minute.

20. The method as in claim 19, wherein the second predetermined time period is about 0.2 seconds.

21. An intelligent electronic device comprising:
at least one sensor configured for sensing at least one electrical parameter distributed to a load;
at least one analog-to-digital converter coupled to the at least one sensor and configured for converting an analog signal output from the at least one sensor to a digital data; and
a processing unit coupled to the at least one analog-to-digital converter configured to receive the digital data, calculate energy consumed by the load and accumulate the calculated energy in a first volatile memory;
the processing unit being configured to iteratively copy the accumulated energy from the first volatile memory to a first non-volatile memory after a first predetermined time period and iteratively copy the accumulated energy from the first volatile memory to a second non-volatile memory after a second predetermined time period, wherein the first predetermined time period is longer than the second predetermined time period,
wherein the second non-volatile memory includes a first buffer and a second buffer and the processing unit is configured to alternate between copying the accumulated energy to the first buffer and the second buffer after the second predetermined time period, and
wherein the second non-volatile memory is configured to retain the accumulated energy in a power loss without use of a battery and is configured to be written to by a single-cycle write.

22. The device in claim 20, wherein the second non-volatile memory can retain the accumulated energy for at least 10 years.

23. The device in claim 21, wherein the second non-volatile memory includes at least 10 billion read/write operations.

24. The device in claim 21, further comprises at least one upgradable input and output (I/O) interface device.

25. The device in claim 24, wherein the I/O interface device reports data via Ethernet protocol using an IEC 61850 protocol.

26. The device of claim 21, wherein the processing unit is further configured to copy the accumulated energy from the second non-volatile memory to the first volatile memory upon a power up of the intelligent electronic device after a power loss or reset of the intelligent electronic device such that contents of the first volatile memory are restored to a similar state just prior to the power loss or reset.

27. The device as in claim 21, wherein the first non-volatile memory is a flash memory.

28. The device as in claim 21, wherein the first non-volatile memory is removable.

29. The device as in claim 28, wherein the second non-volatile memory is at least one of a ferroelectric random access memory (FRAM) and/or a magnetoresistive random access memory (MRAM).

30. The device as in claim 21, wherein the first predetermined time period is about one minute.

31. The device as in claim 30, wherein the second predetermined time period is about 0.2 seconds.

32. The device as in claim 21, further comprising a housing, wherein the housing is at least one of a socket-based housing, an A-based housing, a panel meter housing and a switchboard meter housing.

33. An intelligent electronic device comprising:
at least one sensor configured for sensing at least one electrical parameter distributed to a load;
at least one analog-to-digital converter coupled to the at least one sensor and configured for converting an analog signal output from the at least one sensor to a digital data; and
a processing unit coupled to the at least one analog-to-digital converter configured to receive the digital data, calculate energy consumed by the load and accumulate the calculated energy in a volatile memory;
the processing unit being configured to iteratively copy the accumulated energy from the volatile memory to a non-volatile memory after a predetermined time period,
wherein the non-volatile memory includes a first buffer and a second buffer and the processing unit is configured to alternate between copying the accumulated energy to the first buffer and the second buffer after the predetermined time period and the non-volatile memory is configured to retain the accumulated energy in a power loss without use of a battery and is configured to be written to by a single-cycle write.

34. The device of claim 33, wherein the processing unit is further configured to copy the accumulated energy from the non-volatile memory to the volatile memory upon a power up of the intelligent electronic device after a power loss or reset of the intelligent electronic device such that contents of the volatile memory are restored to a similar state just prior to the power loss or reset.

35. The device as in claim 33, wherein the non-volatile memory is removable.

36. The device as in claim 33, wherein the non-volatile memory is a ferroelectric random access memory (FRAM).

37. The device as in claim 33, wherein the non-volatile memory is a magnetoresistive random access memory (MRAM).

38. The device as in claim 33, wherein the predetermined time period is about 0.2 seconds.

39. The device as in claim 33, further comprising a housing, wherein the housing is at least one of a socket-based housing, an A-based housing, a panel meter housing and a switchboard meter housing.

40. The device in claim 33, wherein the non-volatile memory can retain the accumulated energy for at least 10 years.

41. The device in claim 33, wherein the non-volatile memory includes at least 10 billion read/write operations.

42. The device in claim 33, further comprises at least one upgradable input and output (I/O) interface device, wherein the I/O interface device reports data via Ethernet protocol using an IEC 61850 protocol.

43. The device as in claim 33, wherein the non-volatile memory is flash memory.

44. An intelligent electronic device comprising:
at least one sensor configured for sensing at least one electrical parameter distributed to a load;
at least one analog-to-digital converter coupled to the at least one sensor and configured for converting an analog signal output from the at least one sensor to a digital data; and
a processing unit coupled to the at least one analog-to-digital converter configured to receive the digital data, calculate energy consumed by the load and accumulate the calculated energy in a volatile memory;
the processing unit being configured to iteratively copy the accumulated energy from the volatile memory to a non-volatile memory after a predetermined time period,
wherein the non-volatile memory is configured to retain the accumulated energy in a power loss without use of a battery and is configured to be written to by a single-cycle write and the processing unit is further configured to copy the accumulated energy from the non-volatile memory to the volatile memory upon a power up of the intelligent electronic device after a power loss or reset of the intelligent electronic device such that contents of the volatile memory are restored to a similar state just prior to the power loss or reset.

45. The device as in claim 44, wherein the non-volatile memory is removable.

46. The device as in claim 44, wherein the non-volatile memory is at least one of a ferroelectric random access memory (FRAM) and/or a magnetoresistive random access memory (MRAM).

47. The device as in claim 44, wherein the predetermined time period is about 0.2 seconds.

48. The device as in claim 44, further comprising a housing, wherein the housing is at least one of a socket-based housing, an A-based housing, a panel meter housing and a switchboard meter housing.

49. The device in claim 44, wherein the non-volatile memory can retain the accumulated energy for at least 10 years.

50. The device in claim 44, wherein the non-volatile memory includes at least 10 billion read/write operations.

* * * * *